US012803581B2

(12) United States Patent
Seah et al.

(10) Patent No.: US 12,803,581 B2
(45) Date of Patent: Nov. 17, 2026

(54) MICRO-POWER CONTINUOUS-TIME DELTA-SIGMA ANALOG-TO-DIGITAL CONVERTER FOR AUDIO APPLICATIONS

(71) Applicant: Silicon Laboratories Inc., Austin, TX (US)

(72) Inventors: Yun Da Bryan Seah, Mountain View, CA (US); Tak Ying Wong, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 99 days.

(21) Appl. No.: 18/899,056

(22) Filed: Sep. 27, 2024

(65) Prior Publication Data

US 2026/0095193 A1 Apr. 2, 2026

(51) Int. Cl.
*H03M 3/00* (2006.01)

(52) U.S. Cl.
CPC ........... *H03M 3/458* (2013.01); *H03M 3/422* (2013.01); *H03M 3/436* (2013.01)

(58) Field of Classification Search
CPC ....... H03M 3/458; H03M 3/422; H03M 3/436
USPC ......................................... 341/143, 155, 144
See application file for complete search history.

(56) References Cited

U.S. PATENT DOCUMENTS 11,606,102 B2 * 3/2023 Zhang .................. H03M 3/404

OTHER PUBLICATIONS

Breems, L., et al., "A 2.2 GHz Continuous-Time ΔΣ ADC With -102 dBc THD and 25 MHz Bandwidth," IEEE Journal of Solid-State Circuits, vol. 51, No. 12, Dec. 2016, pp. 2906-2916.
Jang, M., et al., "Analysis and Design of Low-Power Continuous-Time Delta-Sigma Modulator Using Negative-R Assisted Integrator," IEEE Journal of Solid-State Circuits, vol. 54, No. 1, Jan. 2019, pp. 277-287.
Schreier, R., "Delta Sigma Toolbox," (https://www.mathworks.com/matlabcentral/fileexchange/19-delta-sigma-toolbox), MATLAB Central File Exchange, downloaded Aug. 15, 2024, 8 pages.
Sukumaran, A. and Pavan, S., "Low Power Design Techniques for Single-Bit Audio Continuous-Time Delta Sigma ADCs Using FIR Feedback," IEEE Journal of Solid-State Circuits, vol. 49, No. 11, Nov. 2014, pp. 2515-2525.

* cited by examiner

*Primary Examiner* — Peguy Jean Pierre
(74) *Attorney, Agent, or Firm* — Zagorin Cave LLP

(57) ABSTRACT

A low-power, low-noise analog front-end for audio applications includes a continuous-time delta-sigma analog-to-digital converter using finite impulse response filter digital-to-analog feedback, and a loop filter having a single-op-amp resonator with output-referred, negative-resistance assistance in series with a negative-resistance assisted integrator. A method for converting an analog signal to a digital signal includes receiving a continuous-time received signal, combining the continuous-time received signal with a continuous-time feedback signal to generate a combined continuous-time signal, filtering the combined continuous-time signal to generate a loop filtered signal, generating an output bit stream based on the loop filtered signal, and generating the continuous-time feedback signal based on the output bit stream. The filtering includes amplifying a combination of the combined continuous-time signal, a negative feedback signal, and a positive feedback signal to generate an amplified signal. The filtering includes integrating the amplified signal to generate the loop filtered signal.

19 Claims, 9 Drawing Sheets

MICRO-POWER CONTINUOUS-TIME DELTA-SIGMA ANALOG-TO-DIGITAL CONVERTER FOR AUDIO APPLICATIONS

BACKGROUND

Field of the Invention

This invention relates to integrated circuits and more particularly to integrated circuits including an analog front-end.

Description of the Related Art

In an exemplary audio application, an analog front-end receives a signal from an off-chip transducer and converts the analog signal to a digital signal for processing in a low-power application having a frequency band of interest (e.g., 4 kHz or 8 kHz bandwidth) and a dynamic range requirement (e.g., 70 dB). In the exemplary audio application, the digital signal may be processed by backend circuitry including a high-power circuit (e.g., a convolutional neural network for keyword or speech detection) or a lower power neural network (e.g., an auxiliary neural network for activity detection) to implement artificial intelligence or machine learning techniques. To reuse the analog front-end in various applications including wired and wireless applications, a versatile analog front-end having low power consumption and a dynamic range of approximately 70 dB over a frequency range of 20 Hz-20 kHz is desired.

SUMMARY OF EMBODIMENTS OF THE INVENTION

In at least one embodiment, an analog front-end includes a delta-sigma analog-to-digital converter configured to convert a continuous-time received signal to a digital signal. The delta-sigma analog-to-digital converter includes a summing circuit configured to combine the continuous-time received signal and a continuous-time feedback signal. The delta-sigma analog-to-digital converter includes a loop filter configured to generate a loop filter output signal based on an output of the summing circuit. The delta-sigma analog-to-digital converter includes a quantizer configured to generate an output bit stream based on the loop filter output signal. The delta-sigma analog-to-digital converter includes a feedback circuit configured to generate the continuous-time feedback signal based on the output bit stream. The loop filter includes an integrator circuit and a single-operational amplifier resonator circuit coupled in series with the integrator circuit. The single-operational amplifier resonator circuit may be a filter having two poles and one zero. The single-operational amplifier resonator circuit may include a forward path, a positive feedback path, and a negative feedback path. The loop filter may further include a negative resistance assistant circuit coupled to an input of the integrator circuit. The negative resistance assistant circuit may include a negative resistance coupled across differential input terminals of the integrator circuit. The loop filter may further include an output-referred negative resistance assistant coupled to differential output terminals of the single-operational amplifier resonator circuit. The output-referred negative resistance assistant may include a digital-to-analog converter circuit coupled to the differential output terminals of the single-operational amplifier resonator circuit, and a transconductance circuit coupled to the differential output terminals of the single-operational amplifier resonator circuit. The feedback circuit may include a finite-impulse response digital-to-analog converter circuit configured to generate the continuous-time feedback signal based on the output bit stream.

In at least one embodiment, a method for converting an analog signal to a digital signal includes receiving a continuous-time received signal, combining the continuous-time received signal with a continuous-time feedback signal to generate a combined continuous-time signal, filtering the combined continuous-time signal to generate a loop filtered signal, generating an output bit stream based on the loop filtered signal, and generating the continuous-time feedback signal based on the output bit stream. The filtering includes amplifying a combination of the combined continuous-time signal, a negative feedback signal, and a positive feedback signal to generate an amplified signal. The filtering includes integrating the amplified signal to generate the loop filtered signal. The amplifying may be associated with a passband of a transfer function of an operational amplifier configured as a bandpass filter. The method may include combining the amplified signal with a negative resistance compensation current linearly related to a virtual ground voltage of an operational amplifier used by the amplifying. The method may include combining the amplified signal with an output-referred negative-resistance compensation signal. The method may include generating the output-referred negative-resistance compensation signal using a digital-to-analog converter. The method may include providing a version of an inverted output signal of an operational amplifier to an inverting input node of the operational amplifier. The method may include providing a version of a non-inverted output signal of the operational amplifier to a non-inverting input node of the operational amplifier.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A low-power, low-noise analog front-end for audio applications includes a continuous-time delta-sigma analog-to-digital converter using finite impulse response filter digital-to-analog feedback, and a loop filter having a single-op-amp resonator with output-referred, negative-resistance assistance in series with a negative-resistance assisted integrator. An embodiment of the low-power, low-noise analog front-end achieves a signal-to-noise ratio of ~70 dB, a dynamic range of 4-6 effective number of bits, over a bandwidth of 4 kHz or 8 kHz for audio applications.

Figure 1:
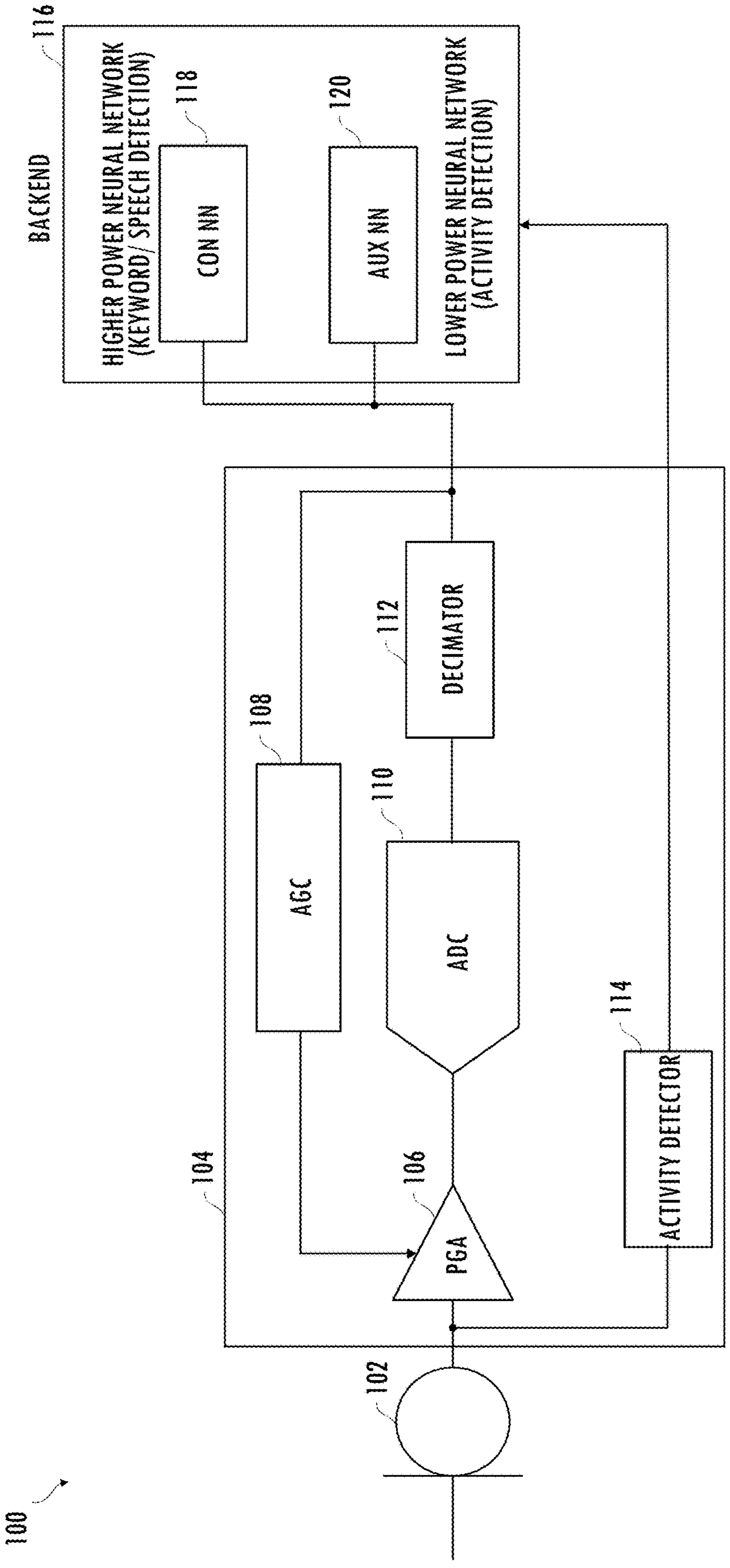
FIG. 1 illustrates a functional block diagram of an integrated circuit including an analog front-end circuit for a low-power audio application.
Figure 2:
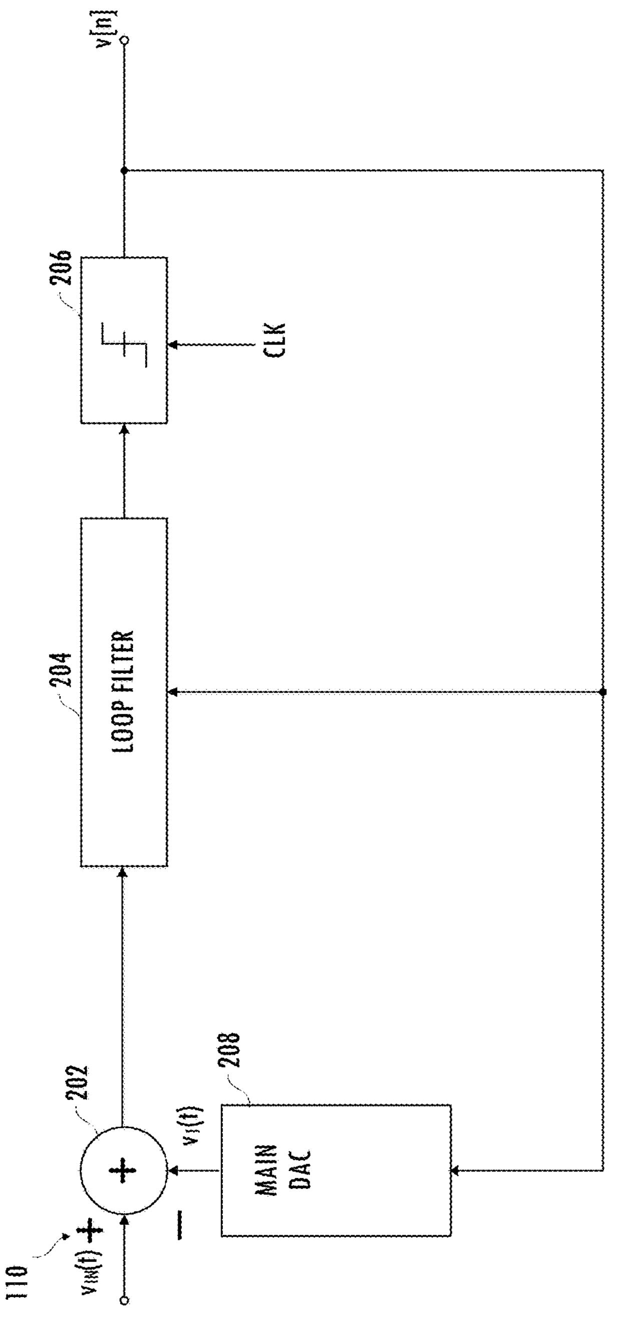
FIG. 2 illustrates a functional block diagram of a continuous-time delta-sigma analog-to-digital converter.

Referring to FIG. 1, in an exemplary audio application, integrated circuit system 100 includes microphone 102, which converts sound into an analog signal provided to analog front-end 104 and received by programmable gain amplifier 106. Programmable gain amplifier 106 amplifies the analog signal and provides the amplified analog signal to analog-to-digital converter 110. In at least one embodiment, the audio signal is oversampled (e.g., with an over sample rate of 40) and decimator 112 reduces the sample rate and provides a decimated audio signal to backend circuit 116. In addition, the decimated audio signal is amplified by automatic gain control circuit 108 to generate a feedback signal used to control programmable gain amplifier 106. In at least one embodiment backend circuits 116 perform artificial intelligence or machine learning processing, e.g., keyword speech detection using convolutional neural network processing 118 or activity detection using auxiliary neural network processing 120. Analog-to-digital converter 110 is a continuous-time delta-sigma analog-to-digital converter having a topology of FIG. 2, which is a low-power circuit that can be easily driven by a programmable gain amplifier. Summing circuit 202 (e.g., a summing node) generates the difference between a received continuous-time signal $v_{IN}(t)$ with feedback signal $v_1(t)$. That difference is input to loop filter 204, which generates a noise-shaped signal. Quantizer 206 generates an output bit stream v[n] based on the noise-shaped signal.

Figure 3:
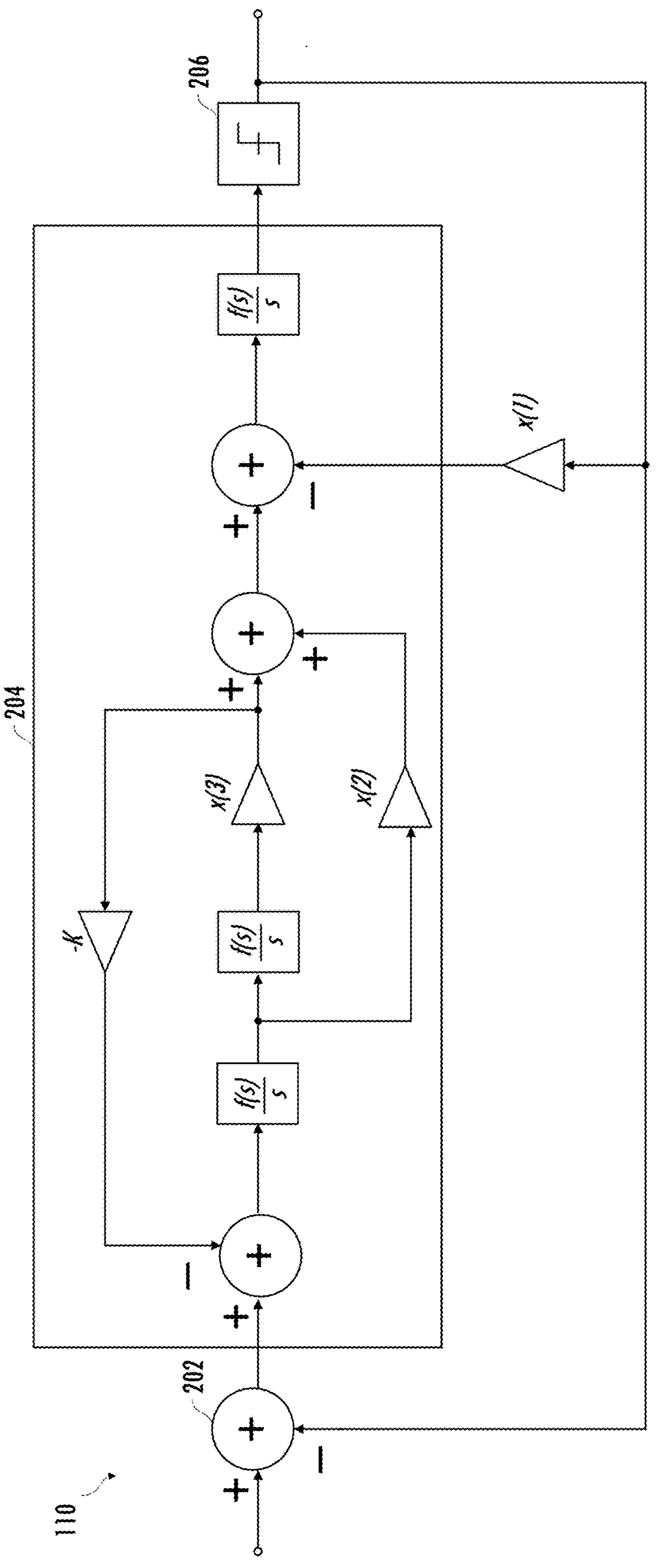
FIG. 3 illustrates a digital model of the continuous-time delta-sigma analog-to-digital converter of FIG. 2.

In applications where a low power clock signal is used, quantizer 206 is a single-bit quantizer that reduces the complexity of a system as compared to a delta-sigma modulator using a multi-bit quantizer. However, the single-bit quantizer may result in relatively high jitter. Accordingly, a continuous-time feedback signal provided by main digital-to-analog converter 208 is used with the single-bit quantizer to reduce error as a result of jitter. The continuous-time feedback signal is generated using a finite-impulse response (FIR) filter that mimics a multibit quantizer in the feedback path and a digital-to-analog converter (DAC). In addition to reducing jitter, the filtering property of the FIR feedback DAC slightly improves the signal-to-quantization noise ratio (SQNR). A model of an exemplary third-order, continuous-time delta-sigma modulator having a cascade of resonators with feedforward (CRFF) structure is illustrated in FIG. 3.

Figure 4:
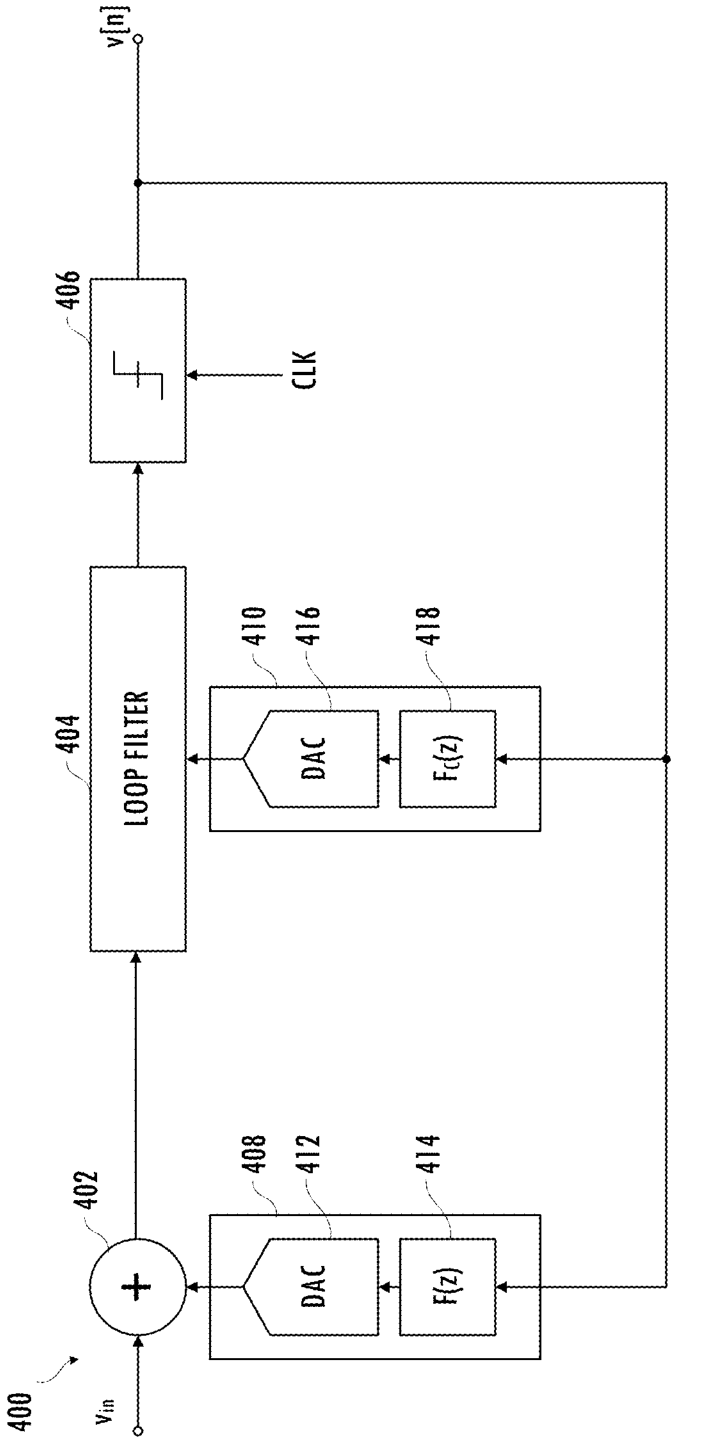
FIG. 4 illustrates a functional block diagram of a continuous-time delta-sigma analog-to-digital converter using a finite-impulse response (FIR) feedback digital-to-analog converter (DAC).
Figure 5:
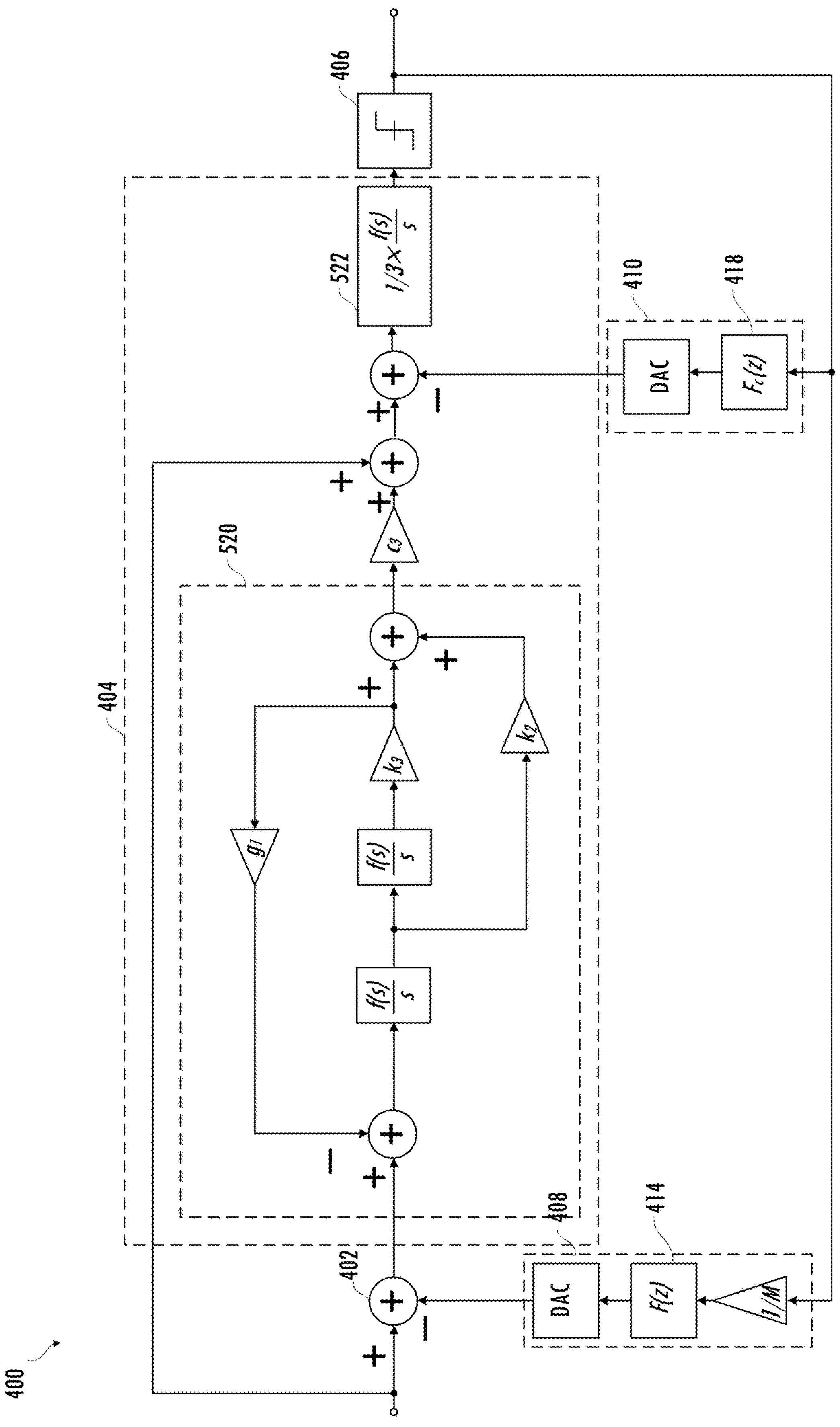
FIG. 5 illustrates a digital model of the continuous-time delta-sigma analog-to-digital converter with FIR feedback DACs.
Figure 6:
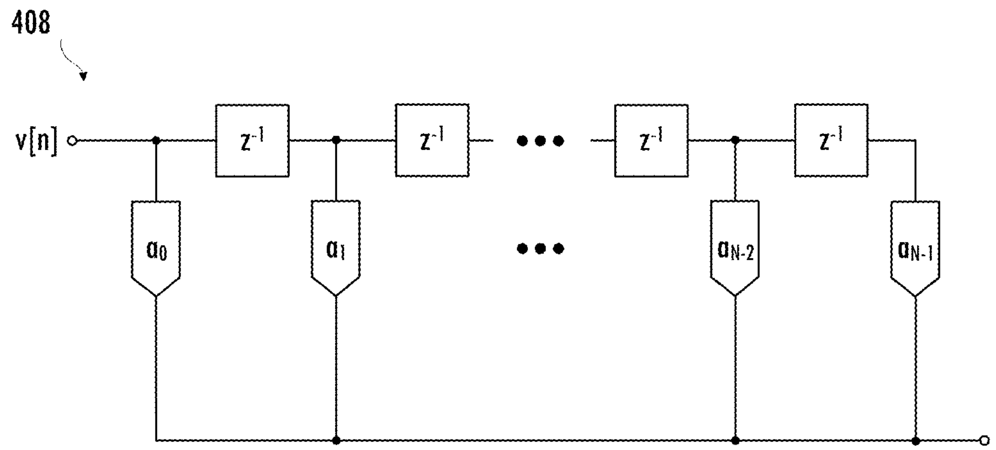
FIG. 6 illustrates a digital model of an FIR feedback DAC of FIG. 5.

Referring to FIGS. 4-6, continuous-time analog-to-digital converter 400 includes FIR feedback DAC 408 that filters the digital output of single-bit quantizer 406 to generate a continuous-time feedback signal. The high frequency attenuation of the FIR feedback DAC causes FIR filter 414 to output a multilevel waveform, like in a multi-bit quantizer. As a result, the FIR feedback DAC technique has a low clock jitter sensitivity and relaxes linearity requirements of loop filter 404. A semi-digital implementation of an FIR feedback DAC is inherently linear regardless of device mismatch. By implementing a single-bit quantizer instead of a multi-bit quantizer, continuous-time analog-to-digital converter 400 consumes less power and has a simpler design than multi-bit quantizer solutions. Since the feedback waveform is delayed, the delta-sigma modulator of continuous-time analog-to-digital converter 400 (e.g., summing circuit 402, loop filter 404, and single-bit quantizer 406) is stabilized using compensation FIR feedback DAC 410 to restore the noise transfer function (NTF).

In general, an increase in the number of taps in an FIR filter generally increases filtering of shaped quantization noise. However, as the number of taps increases beyond a certain value, negligible benefits are achieved. Accordingly, the number of taps of FIR filter 414 and FIR filter 418 are selected according to a tradeoff of signal transfer function (STF) peaking and power dissipation due to additional taps that still achieve a benefit for the STF of a target loop filter topology. In an embodiment, FIR feedback DAC 408 and compensation FIR feedback DAC 410 each include six taps that are implemented by resistors. In an embodiment, compensation FIR feedback DAC 410 and FIR feedback DAC 408 use different FIR-DAC coefficients and have different circuit implementations. In an embodiment, compensation FIR feedback DAC 410 has coefficients that stabilize the loop and restore the NTF (e.g., increases the gain at high frequencies). A digital representation of FIR feedback DAC 408 is:

$$F(z) = \frac{1}{6}\left(1 + z^{-1} + z^{-2} + z^{-3} + z^{-4} + z^{-5}\right).$$

A digital representation of compensation FIR feedback DAC 410 is:

$$Fc(z) = 0.9327 + 0.2719z^{-1} + 0.2325z^{-2} + 0.1810z^{-3} + 0.1174z^{-4} + 0.1174z^{-5}.$$

However, other numbers of taps or other circuit implementations may be used. Although some embodiments of an FIR feedback DAC implement separate circuits for the FIR filtering and the digital-to-analog conversion, some embodiments of the FIR feedback DAC use a circuit implementation that combines the FIR filtering functions 414 and 418 and the digital-to-analog conversion functions 412 and 416, respectively.

Referring to FIG. 5, in an embodiment of continuous-time analog-to-digital converter 400, loop filter 404 is a bandpass filter having a resonance frequency tuned to a frequency within a target band of interest and attenuates quantization noise in the band of interest. In at least one embodiment, loop filter 404 comprises a second order continuous-time loop filter including a biquadratic amplifier having two-poles and at least one zero in series with an integrator. In at least one embodiment, loop filter 404 includes a resonator section having a transfer function including one zero and two poles. Typical implementations of an op-amp resonator include two amplifier stages to achieve resonation. A band-pass filter in positive feedback amplifies the transfer function at the passband and rejects the stopband, thereby boosting the quality factor (Q). In an embodiment, single amplifier biquad 520 is a single-operational amplifier resonator circuit (i.e., a single amplifier biquadratic active filter) having a partial feedback and feedforward architecture. In an embodiment, single amplifier biquad 520 has internal feedforward coefficients ($k_2$, $k_3$) and local feedback coefficient ($g_1$), where $k_2$=0.5361, $k_3$=0.0724, $g_1$=0.0511, and $c_3$=1.

In at least one embodiment, rather than use a two-stage feedforward compensated operational amplifier (i.e., op-amp) design that achieves high gain, a single amplifier biquad is used to implement single amplifier biquad 520. In at least one embodiment of single amplifier biquad 520, an active RC filter uses positive feedback to implement single amplifier biquad 520 and eliminates one amplifier.

Figure 7:
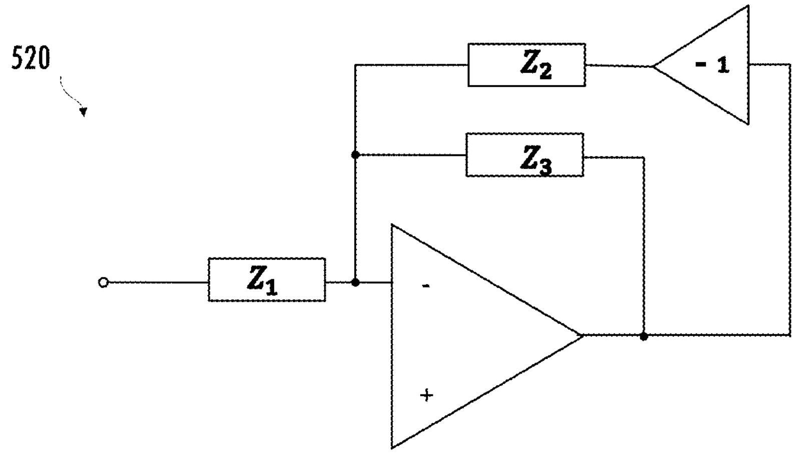
FIG. 7 illustrates a circuit model of a single amplifier biquadratic active filter (single amplifier biquad) of the loop filter of FIG. 4.
Figure 8:
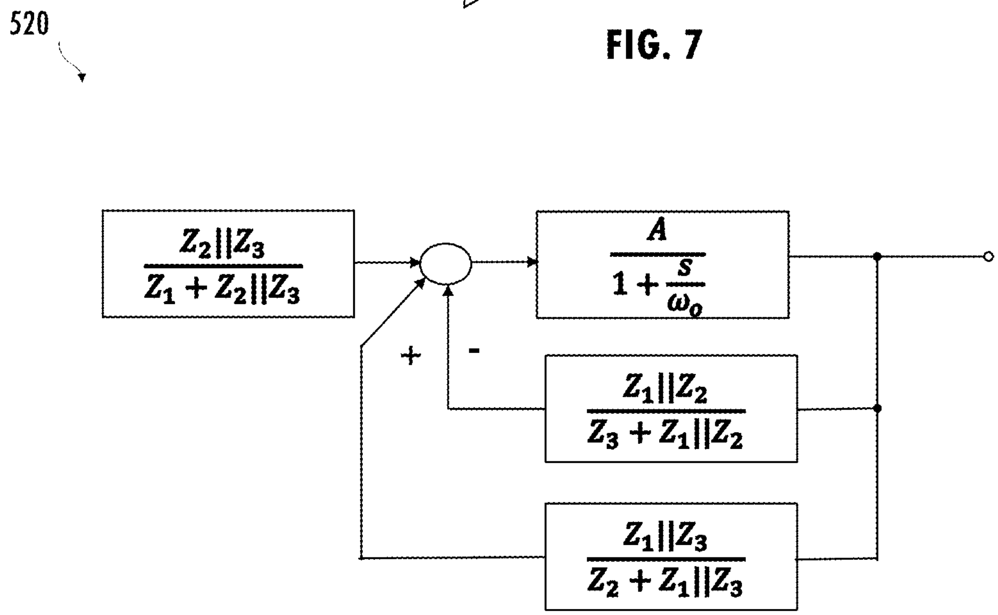
FIG. 8 illustrates a signal flow diagram of the single amplifier biquad of the loop filter of FIG. 4.

Referring to FIGS. 7 and 8, single amplifier biquad 520 is implemented using a single-operational amplifier where $$Z_1 = R_1;\ Z_2 = R_2 + \frac{1}{sC_2};$$

$$Z_3 = R_3 \| \frac{1}{sC_3};$$

and the resonance condition is:

$$R_3C_3 + R_2C_2 - R_3C_2 = 0.$$

For an exemplary audio application, the zero is set at a low frequency (e.g., 18 kHz) to reduce in-band quantization noise. The zeros are inherent in the single-op-amp resonator and no additional summing amplifiers are needed. A differential structure is used and positive feedback is used to implement the resonator by cross-coupling the differential pair of output terminals to the differential pair of feedback paths.

Referring back to FIG. 5, in at least one embodiment, integrator 522 determines the noise and linearity performance of the continuous-time delta-sigma modulator and may consume substantial amounts of power to achieve target noise and linearity performance.

Figure 9:
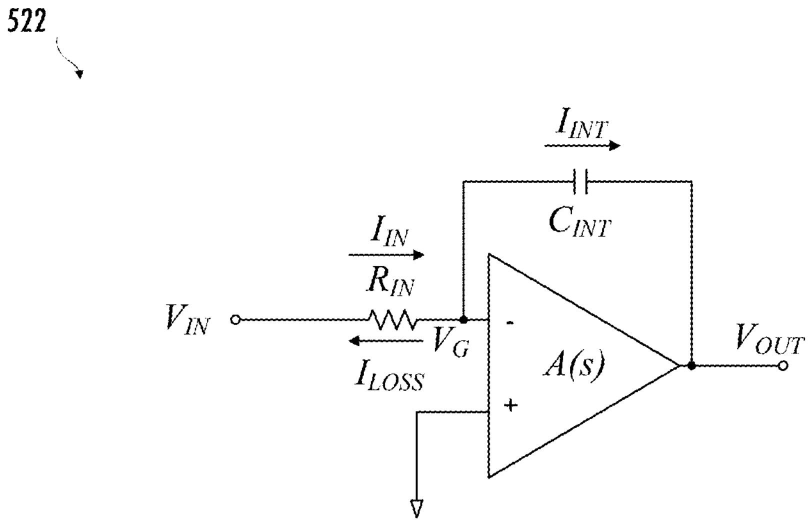
FIG. 9 illustrates a circuit model of an integrator of the loop filter of FIG. 4.

FIG. 9 illustrates an active-RC integrator that has a finite response that makes the virtual ground non-ideal ($V_G$!=0) and causes current loss. As a result of the finite gain and bandwidth of the op-amp, the integrating current $I_{INT}$(=$I_{IN}$−$I_{LOSS}$) has loss of magnitude and bandwidth, thus resulting in a lossy integrator.

$$\frac{V_{OUT}}{V_{IN}} = G_mR_L;$$

$$\omega_0 = \frac{1}{R_{IN}C_{INT}} \times \frac{1}{1 + \frac{1}{G_mR_{IN}}}.$$

Figure 10:
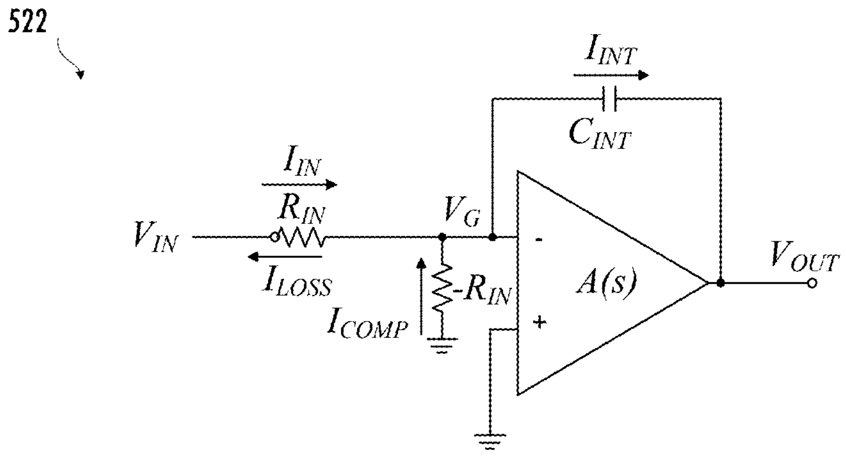
FIG. 10 illustrates a circuit model of a negative-R assisted integrator.

Referring to FIG. 10, in at least one embodiment, integrator 522 is implemented by a negative-R assisted integrator, i.e., an active-RC integrator whose virtual ground is compensated by a negative resistor and achieves low noise and high linearity. The negative-R assisted integrator relaxes op-amp specifications (e.g., DC gain, unity gain bandwidth, noise, and linearity). In particular, negative-resistance assistance attenuates the thermal and 1/f noise and cancels distortion of integrator 522, thereby resulting in power savings. By introducing a current proportional to the virtual ground voltage to compensate for the current loss, the circuit mimics virtual ground operation.

$$\frac{V_{OUT}}{V_{IN}} = \left(\frac{\alpha}{\alpha - 1}\right) \times G_mR_L;$$

$$\omega_0 = \frac{1}{R_{IN}C_{INT}} \times \frac{1}{1 + \frac{1}{G_mR_{IN}} \times \left(\frac{\alpha}{\alpha - 1}\right)}.$$

For a negative resistor with resistance $-\alpha R_{IN}$, when α=1, integrator 522 becomes ideal and exhibits no droop at DC. This condition is met if the injected current is equal to the input current, i.e., $$\frac{1}{R_{IN}}.$$

This preserves the NTF of the analog-to-digital converter and maintains its noise-shaping transfer function at DC. NTF leakage results in an increase in the quantization noise level at DC, which is proportional to $$\frac{1}{|NTC\_DC|}.$$

The negative resistance can be implemented using a voltage-controlled current source dependent on $V_G$ (i.e., a transconductance). When negative-R is applied at the virtual ground, compensation current $I_{COMP}$ is generated from the ground to attenuate or cancel out $I_{LOSS}$ and effectively make the virtual ground ideal ($V_G$=0). Therefore, $I_{LOSS}$ caused by the finite gain and bandwidth of the op-amp in the integrator is compensated and $I_{INT}$ becomes equal to the input current $I_{IN}$. This technique introduces a zero at DC in the transfer function of the noise of the amplifier to the input of the analog-to-digital converter.

Figure 11:
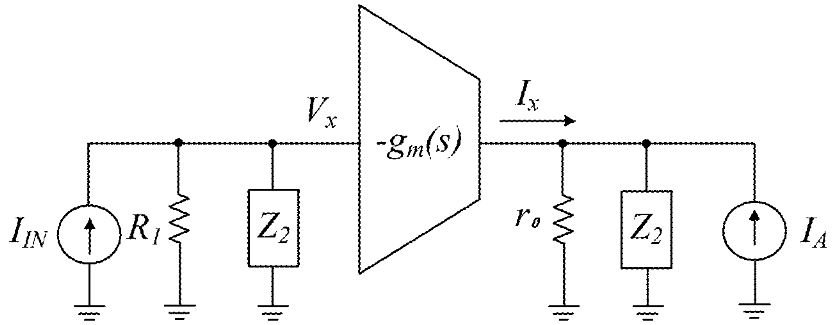
FIG. 11 illustrates a signal flow diagram of the negative-R assisted integrator of FIG. 10.
Figure 12:
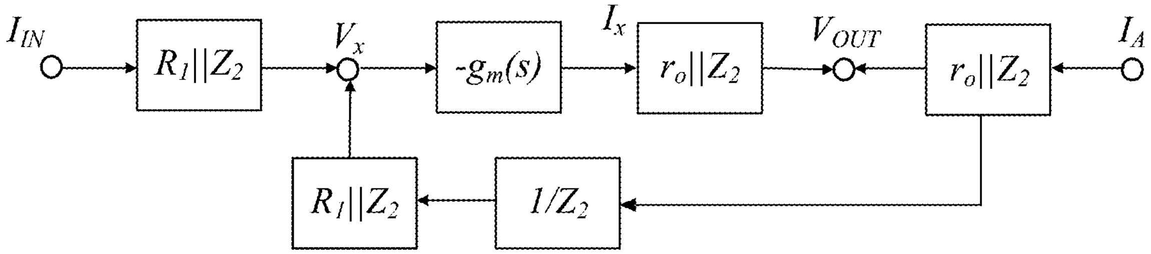
FIG. 12 illustrates an equivalent circuit of a negative-R assisted integrator of FIG. 10.
Figure 13:
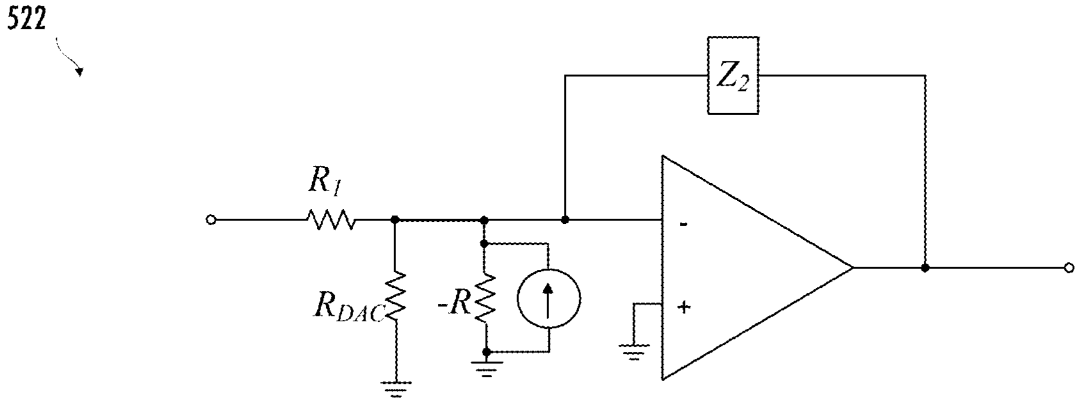
FIG. 13 illustrates an equivalent circuit using a negative-R assisted integrator.

In an embodiment, using a negative resistor at the input of single amplifier biquad 520 introduces substantial noise. To address noise introduced by a negative resistor, an inverted replica of the current feeding in at the output of single amplifier biquad 520 is applied, i.e., the negative-resistance operation is output-referred. The noise of the negative-resistance is attenuated by the gain of the single amplifier biquad 520, making the gain of single amplifier biquad 520 the dominant source of noise. In at least one embodiment, negative-resistance assistant 1410 includes a class AB transconductance amplifier that is driven by inverted outputs of single amplifier biquad 520 and digital-to-analog converter 1408. That is, an inverted replica of the current feeds in at the output of single amplifier biquad 520. FIGS. 11 and 12 illustrate an equivalent circuit and signal model for an output-referred negative-resistance assistant. Current $I_A$ is an inverted replica of the current feeding into the amplifier output. FIG. 13 illustrates a model of the noise of the amplifier as compared to the noise of the negative resistor.

If the negative resistance equals the input resistance $R_{IN}$, then the integrator exhibits an ideal transfer function and DC. However, the noise of the system increases since a negative resistor is typically implemented using a transconductor, which injects noise directly at the input. If the negative-resistance assistant is output-referred, then the noise is injected at the output node and has a negligible effect when input-referred. Use of the output-referred negative-resistance assistant causes the noise of single amplifier biquad 520 to dominate. For the output-referred negative-resistance assistant to be beneficial, the noise of single amplifier biquad 520 needs to be lower than the noise of the negative resistor, i.e., $$g_{m,amp} > \frac{1}{R_1 \| R_{DAC}}.$$

In an embodiment, this condition is satisfied by $$\frac{1}{R_1 \| R_{DAC}} = 0.5$$

μS and $g_{m,amp}$ being in the range of a few μS.

Figure 14:
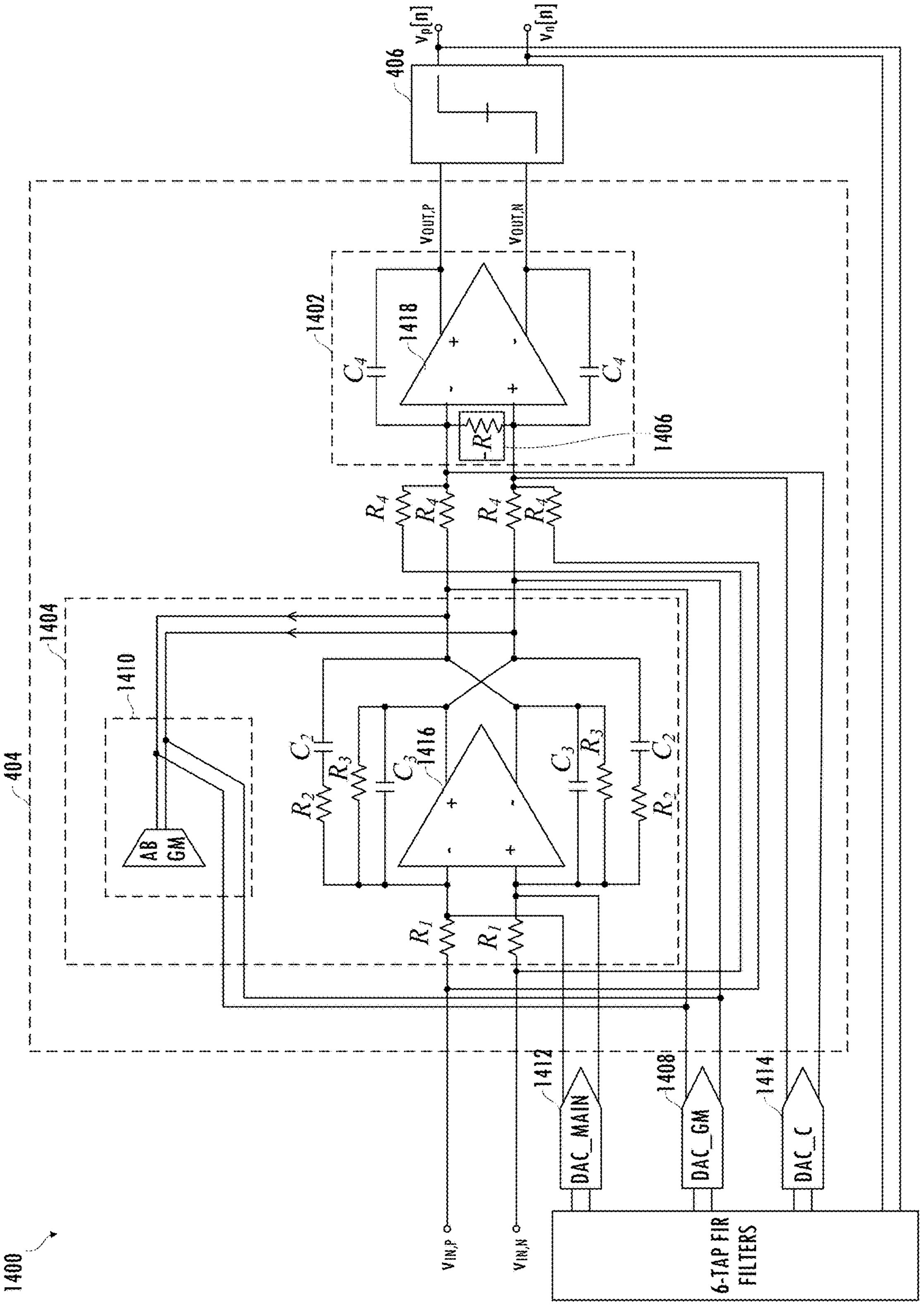
FIG. 14 illustrates a circuit diagram of a low-power, continuous-time delta-sigma analog-to-digital converter consistent with at least one embodiment of the invention.

FIG. 14 illustrates continuous-time delta-sigma analog-to-digital converter 1400 including an FIR feedback DAC, a compensation FIR feedback DAC, and a loop filter having a single amplifier biquad and an output-referred negative-resistance assistance circuit in series with a negative-resistance assisted integrator. In an embodiment, an analog front-end including continuous-time delta-sigma analog-to-digital converter 1400 consumes relatively low power (e.g., micro-amps) and is versatile enough for use in various audio applications (e.g., audio recognition, voice activity detector, key word spotting, etc.). In at least one embodiment, a continuous-time delta-sigma analog-to-digital converter 1400 has low jitter and achieves a signal-to-noise ratio of ~70 dB and a dynamic range of 4-6 effective number of bits, which is sufficient for audio recognition applications. In an embodiment, continuous-time delta-sigma analog-to-digital converter 1400 has a bandwidth of 4 kHz or 8 kHz for a target audio application, but in other embodiments, continuous-time delta-sigma analog-to-digital converter 1400 is implemented to have a different bandwidth for a different target application. The FIR feedback DACs 1412 and 1414 inject currents proportional to the reference into virtual grounds of the operational amplifier. The FIR feedback DACs reduce jitter sensitivity and relax clocking requirements. Single amplifier biquad 1404 has a differential structure that facilitates using positive feedback to realize two poles in the loop filter. To stabilize the loop so that the noise transfer function is restored, a compensation finite-impulse response digital-to-analog converter is added at the input of integrator 1402, and the loop filter coefficients are tuned.

In at least one embodiment, single amplifier biquad 1404 has a high swing requirement, i.e., use gain on the output stage to allow for swing in the input stage. Therefore, amplifier 1416 includes an input stage (e.g., a differential pair of transistors) that are formed from silicon-on-insulator (SOI) transistors for adequate transconductance efficiency (i.e., $g_m/I_d$) and noise. In at least one embodiment, amplifier 1416 reduces the output resistance per unit current in the output stage by using laterally-diffused metal-oxide semiconductor (LDMOS) transistors in the output stage. However, other embodiments of amplifier 1416 use different circuit implementations. In an embodiment, the differential pair of output terminals of amplifier 1416 are cross-coupled to the inputs of amplifier 1416 and negative-resistance assistant 1410 resulting in positive feedback to amplifier 1416 and an inverted replica of the input current feeding in at the output of amplifier 1416, respectively.

In at least one embodiment, integrator 1402 is a negative-resistor assisted amplifier that reduces effects of excess loop delay (ELD) of the analog-to-digital converter (e.g., the delay from quantizer 406 to loop filter 404). In at least one embodiment, negative resistor 1406 is implemented using a constant transconductance bias circuit to cause the transconductance to track the resistance process corners. In an embodiment, integrator 1402 has a lowered swing requirement, therefore the output stage of amplifier 1418 is implemented using a class AB source follower circuit to conserve current. In an embodiment, amplifier 1416 includes SOI transistors in the input stage and the output stage of amplifier 1418 includes forward-biased super-low threshold voltage (SLVT) transistors for a lowered gate-to-source voltage drop. However, in other embodiments, other transistors are used. In at least one embodiment, quantizer 406 is implemented using a strong-arm latch including an amplifying and regeneration stage driving a set-reset latch, although other circuit implementations may be used.

Thus, techniques for implementing a continuous-time delta-sigma analog-to-digital converter have been described. The description of the invention set forth herein is illustrative and is not intended to limit the scope of the invention as set forth in the following claims. For example, while the invention has been described in an embodiment in which a passband for audio applications is used, one of skill in the art will appreciate that the teachings herein can be utilized with other passbands for other applications. The terms "first," "second," "third," and so forth, as used in the claims, unless otherwise clear by context, are to distinguish between different items in the claims and do not otherwise indicate or imply any order in time, location or quality. For example, "a first received signal" and "a second received signal," do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. An analog front-end comprising:

a delta-sigma analog-to-digital converter configured to convert a continuous-time received signal to a digital signal, the delta-sigma analog-to-digital converter comprising:

a summing circuit configured to combine the continuous-time received signal and a continuous-time feedback signal;

a loop filter configured to generate a loop filter output signal based on an output of the summing circuit;

a quantizer configured to generate an output bit stream based on the loop filter output signal; and a feedback circuit configured to generate the continuous-time feedback signal based on the output bit stream, wherein the loop filter comprises:

an integrator circuit; and a single-operational amplifier resonator circuit coupled in series with the integrator circuit, wherein the single-operational amplifier resonator circuit comprises a forward path, a positive feedback path, and a negative feedback path.

2. The analog front-end as recited in claim 1 wherein the single-operational amplifier resonator circuit is a filter having two poles and one zero.

3. The analog front-end as recited in claim 1 wherein the loop filter further comprises:

a negative resistance assistant circuit coupled to an input of the integrator circuit.

4. The analog front-end as recited in claim 3 wherein the negative resistance assistant circuit comprises a negative resistance coupled across differential input terminals of the integrator circuit.

5. The analog front-end as recited in claim 1 further comprising an output-referred negative resistance assistant coupled to differential output terminals of the single-operational amplifier resonator circuit.

6. The analog front-end as recited in claim 5 wherein the output-referred negative resistance assistant comprises:

a digital-to-analog converter circuit coupled to the differential output terminals; and a transconductance circuit coupled to the differential output terminals.

7. The analog front-end as recited in claim 1 wherein the feedback circuit comprises a finite-impulse response digital-to-analog converter circuit configured to generate the continuous-time feedback signal based on the output bit stream.

8. The analog front-end as recited in claim 1 wherein the single-operational amplifier resonator circuit comprises a silicon-on-insulator (SOI) input stage and an output stage comprising laterally-diffused metal-oxide semiconductor (LDMOS) transistors and the integrator circuit comprises a class AB source follower circuit including a second output stage comprising super-low threshold voltage (SLVT).

9. A method for converting an analog signal to a digital signal, the method comprising:

receiving a continuous-time received signal;

combining the continuous-time received signal with a continuous-time feedback signal to generate a combined continuous-time signal;

filtering the combined continuous-time signal to generate a loop filtered signal;

generating an output bit stream based on the loop filtered signal; and generating the continuous-time feedback signal based on the output bit stream, wherein the filtering comprises:

amplifying a combination of the combined continuous-time signal, a negative feedback signal, and a positive feedback signal to generate an amplified signal; and integrating the amplified signal to generate the loop filtered signal.

10. The method as recited in claim 9 wherein the amplifying is associated with a passband of a transfer function of an amplifier configured as a bandpass filter.

11. The method as recited in claim 9 further comprising:

combining the amplified signal with a negative resistance compensation current linearly related to a virtual ground voltage of an amplifier used by the amplifying.

12. The method as recited in claim 11 wherein combination of the amplified signal with the negative resistance compensation current introduces a zero at DC in a transfer function of the amplifier.

13. The method as recited in claim 9 further comprising:

combining the amplified signal with an output-referred negative-resistance compensation signal.

14. The method as recited in claim 13 further comprising:

generating the output-referred negative-resistance compensation signal using a digital-to-analog converter.

15. The method as recited in claim 9 further comprising:

generating the continuous-time feedback signal by digital-to-analog conversion of the output bit stream.

16. The method as recited in claim 9 wherein the filtering further comprises:

providing a version of an inverted output signal of an operational amplifier to an inverting input node of the operational amplifier; and providing a version of a non-inverted output signal of the operational amplifier to a non-inverting input node of the operational amplifier.

17. An apparatus for converting an analog signal to a digital signal, the apparatus comprising:

means for combining a continuous-time received signal with a continuous-time feedback signal to generate a combined continuous-time signal;

means for amplifying a combination of the combined continuous-time signal, a negative feedback signal, and a positive feedback signal to generate an amplified signal;

means for integrating the amplified signal to generate a loop filtered signal;

means for generating an output bit stream based on the loop filtered signal; and means for generating the continuous-time feedback signal based on the output bit stream.

18. The apparatus as recited in claim 17 further comprising:

means for compensating for current loss of the means for integrating.

19. The apparatus as recited in claim 18 further comprising:

means for compensating for noise introduced by the means for compensating for current loss.

* * * * *